(12) United States Patent
Ichinokura et al.

(10) Patent No.: US 11,664,480 B2
(45) Date of Patent: May 30, 2023

(54) SEMICONDUCTOR PACKAGE SUBSTRATE, SEMICONDUCTOR PACKAGE AND SEMICONDUCTOR LIGHT-EMITTING DEVICE

(71) Applicant: NIKKISO CO., LTD., Tokyo (JP)

(72) Inventors: Hiroyasu Ichinokura, Ishikawa (JP); Kazuyoshi Sakuragi, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 0 days.

(21) Appl. No.: 17/177,275

(22) Filed: Feb. 17, 2021

(65) Prior Publication Data

US 2021/0257519 A1 Aug. 19, 2021

(30) Foreign Application Priority Data

Feb. 18, 2020 (JP) .............................. JP2020-025224

(51) Int. Cl.
| | |
|---|---|
| *H01L 33/48* | (2010.01) |
| *H01L 33/60* | (2010.01) |
| *H01L 33/62* | (2010.01) |
| *H01L 33/58* | (2010.01) |

(52) U.S. Cl.
CPC ............ *H01L 33/486* (2013.01); *H01L 33/60* (2013.01); *H01L 33/62* (2013.01)

(58) Field of Classification Search
CPC ......... H01L 33/46; H01L 33/60; H01L 33/58; H01L 33/486; H01L 33/483; H01L 23/02
See application file for complete search history.

(56) References Cited

U.S. PATENT DOCUMENTS

2019/0189870 A1 6/2019 Ichinokura

FOREIGN PATENT DOCUMENTS

| JP | 2012-008265 A | 1/2012 | | |
|---|---|---|---|---|
| JP | 2017-188653 A | 10/2017 | | |
| JP | 2018-37583 A | 3/2018 | | |
| JP | 2019-129256 A | 8/2019 | | |
| KR | 20130127838 A | * 11/2013 | ............ | H01L 33/46 |
| WO | WO-2018043096 A1 | * 3/2018 | ............ | H01L 23/02 |

OTHER PUBLICATIONS

Notice of Reasons for Refusal dated Mar. 22, 2023 received from the Japanese Patent Office in related JP 2020-025224 together with English language translation.

* cited by examiner

*Primary Examiner* — Antonio B Crite
(74) *Attorney, Agent, or Firm* — Scully, Scott, Murphy & Presser, PC

(57) ABSTRACT

A semiconductor package substrate includes a semiconductor housing space including a mounting surface being provided on a bottom side and configured to mount a semiconductor light-emitting element, and a reflective wall being provided around the mounting surface and configured to reflect light emitted from the semiconductor light-emitting element to be mounted on the mounting surface; a mounting region being provided at a rim portion and configured to mount a lid member for covering the semiconductor light-emitting element; and a flow-suppressing portion separating the mounting region and the reflective wall spatially in such a manner that a joining member joining the lid member to the rim portion is suppressed from flowing from the mounting region into the semiconductor housing space.

11 Claims, 9 Drawing Sheets

FIG. 7

| No. | AREA (mm²) | AuSn EUTECTIC SOLDER PREFORM VOLUME (mm³) | THICKNESS (mm) | QUARTZ GLASS JOINING | FIRST FLOW PREVENTING PORTION | REFLECTIVE WALL |
|---|---|---|---|---|---|---|
| 1 | 3.725 | 0.0466 | 0.0125 | NOT JOINED | NOT PROVIDED | VERTICAL SURFACE |
| 2 | 4.965 | 0.0466 | 0.0094 | SUCCESSFULLY JOINED | NOT PROVIDED | VERTICAL SURFACE |
| 3 | 5.615 | 0.0466 | 0.0083 | SUCCESSFULLY JOINED | NOT PROVIDED | VERTICAL SURFACE |
| 4 | 4.538 | 0.0466 | 0.0103 | NOT JOINED | NOT PROVIDED | INCLINED SURFACE |
| 5 | 4.374 | 0.0466 | 0.0107 | NOT JOINED | NOT PROVIDED | INCLINED SURFACE |
| 6 | 4.374 | 0.0466 | 0.0107 | NOT JOINED | PROVIDED | INCLINED SURFACE |
| 7 | 4.374 | 0.0466 | 0.0107 | NOT JOINED | PROVIDED | INCLINED SURFACE |
| 8 | 5.313 | 0.0466 | 0.0088 | SUCCESSFULLY JOINED | PROVIDED | INCLINED SURFACE |

SEMICONDUCTOR PACKAGE SUBSTRATE, SEMICONDUCTOR PACKAGE AND SEMICONDUCTOR LIGHT-EMITTING DEVICE

CROSS-REFERENCE TO RELATED APPLICATION

The present application is based on Japanese Patent Application No. 2020-025224 filed on Feb. 18, 2020, the entire contents of which are incorporated herein by reference.

BACKGROUND OF THE INVENTION

1. Field of the Invention

The invention relates to a semiconductor package substrate, a semiconductor package and a semiconductor light-emitting device.

2. Related Art

Semiconductor light-emitting devices in which a semiconductor light-emitting element is housed in a cavity provided on a package substrate have been conventionally known. Some of such semiconductor light-emitting devices have a structure in which, e.g., a wall portion of the cavity is inclined to improve efficiency of light extraction from the semiconductor package (see, e.g., JP2018-037583A).

The package substrate of the semiconductor light-emitting device described in JP2018-037583A has a structure in which an inclined light-reflecting surface is provided on the wall portion of the cavity. In addition, a window member transparent to light emitted from the semiconductor light-emitting element is arranged so as to cover an opening of the cavity. Then, the package substrate and the window member are sealed with a joining member made of a low-melting-point metal material including gold-tin (AuSn) alloy.
[Patent Literature 1] JP2018-037583A However, when AuSn eutectic solder is used as the joining member in the semiconductor light-emitting device described in JP2018-037583A, the AuSn eutectic solder may trickle down the wall portion of the cavity and flow into the cavity. If the AuSn eutectic solder flows into the cavity, the amount of the AuSn eutectic solder remaining in a region for mounting the lid member is partially reduced. Then, after the AuSn eutectic solder is cooled and solidified, the thickness of the AuSn eutectic solder becomes different between a portion where the amount of the AuSn eutectic solder is reduced and a portion where the amount is not reduced, and stress is generated between the two portions and may cause the lid member to crack or come off.

THE SUMMARY OF THE INVENTION

Therefore, it is an object of the invention to provide a semiconductor package substrate, a semiconductor package and a semiconductor light-emitting device, in which a joint member is suppressed from flowing into a cavity housing a semiconductor light-emitting element and a lid member can be thereby suppressed from cracking or coming off.

So as to solve the above problem, in one aspect of the invention, a semiconductor package substrate comprises: a semiconductor housing space including a mounting surface being provided on a bottom side and configured to mount a semiconductor light-emitting element, and a reflective wall being provided around the mounting surface and configured to reflect light emitted from the semiconductor light-emitting element to be mounted on the mounting surface; a mounting region being provided at a rim portion and configured to mount a lid member for covering the semiconductor light-emitting element; and a flow-suppressing portion separating the mounting region and the reflective wall spatially in such a manner that a joining member joining the lid member to the rim portion is suppressed from flowing from the mounting region into the semiconductor housing space.

A semiconductor package in another aspect of the invention comprises the semiconductor package substrate and the lid member mounted on the mounting region. A semiconductor light-emitting device in still another aspect of the invention comprises the semiconductor package and the semiconductor light-emitting element mounted on the semiconductor package substrate.

Points of the Invention

According to the invention, it is possible to provide a semiconductor package substrate, a semiconductor package and a semiconductor light-emitting device, in which a joint member is suppressed from flowing into a cavity housing a semiconductor light-emitting element and a lid member can be thereby suppressed from cracking or coming off.

BRIEF DESCRIPTION OF THE DRAWINGS

Next, the present invention will be explained in more detail in conjunction with appended drawings, wherein:

FIGS. 3A and 3B are diagrams illustrating an example configuration of a semiconductor package substrate, wherein FIG. 3A is a plan view and FIG. 3B is a cross sectional view taking along A-A in FIG. 1;

FIGS. 5A and 5B are diagrams illustrating an example configuration of a semiconductor light-emitting device, wherein FIG. 5A is a plan view and FIG. 5B is a vertical cross-sectional view;

FIGS. 6A and 6B are photographic images showing an example result of adhesion between the semiconductor package substrate and the lid member, wherein FIG. 6A is a semiconductor light-emitting device in Comparative Example and FIG. 6B is a semiconductor light-emitting device in Example of the invention;

FIG. 7 is a diagram in which the results of examining whether or not the lid member was successfully joined in some experimentally-manufactured semiconductor light-emitting devices are shown in a table;

DESCRIPTION OF THE PREFERRED EMBODIMENT

Embodiment

An embodiment of the invention will be described in reference to the drawings. The embodiment below is described as a preferred illustrative example for implementing the invention. Although some part of the embodiment specifically illustrates various technically preferable matters, the technical scope of the invention is not limited to such specific aspects.

Figure 1:
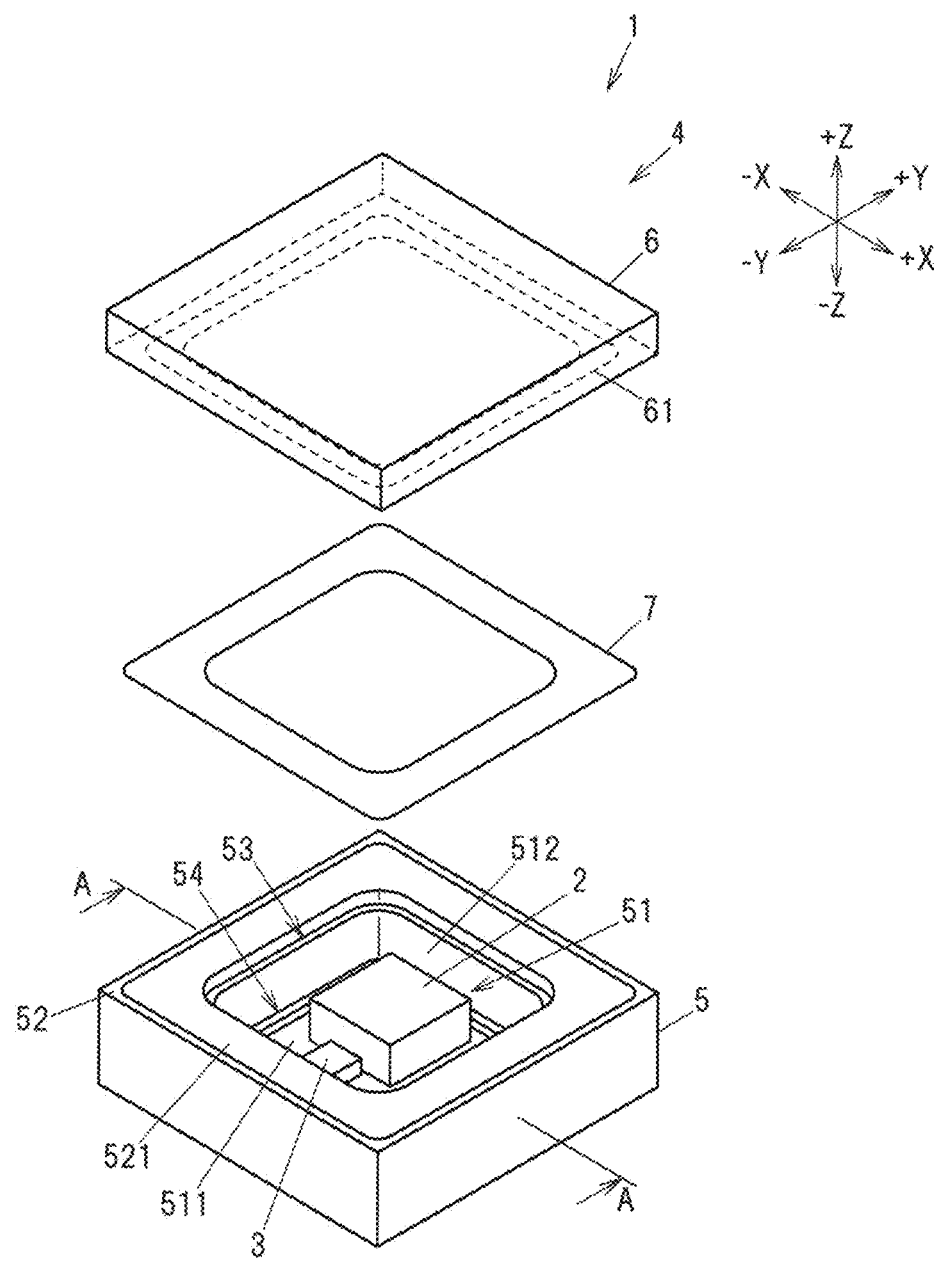
FIG. 1 is an explanatory exploded perspective view showing a configuration of a semiconductor light-emitting device in an embodiment of the present invention.

FIG. 1 is an explanatory exploded perspective view showing a configuration of a semiconductor light-emitting device in an embodiment of the invention. As shown in FIG. 1, a semiconductor light-emitting device 1 is provided with a semiconductor light-emitting element 2, a protective element 3 serving to protect the semiconductor light-emitting element 2 or a circuit, and a semiconductor package 4 enclosing and protecting the semiconductor light-emitting element 2 and the protective element 3. Next, each constituent element will be described in detail.

(Semiconductor Light-Emitting Element 2)

Examples of the semiconductor light-emitting element 2 includes transistor, laser diode (LD), light-emitting diode (LED), etc. In the present embodiment, a light-emitting diode which emits light with a wavelength in the ultraviolet region (especially, deep ultraviolet light with a central wavelength of not more than 300 nm) is described as an example of the semiconductor light-emitting element 2.

Figure 2:
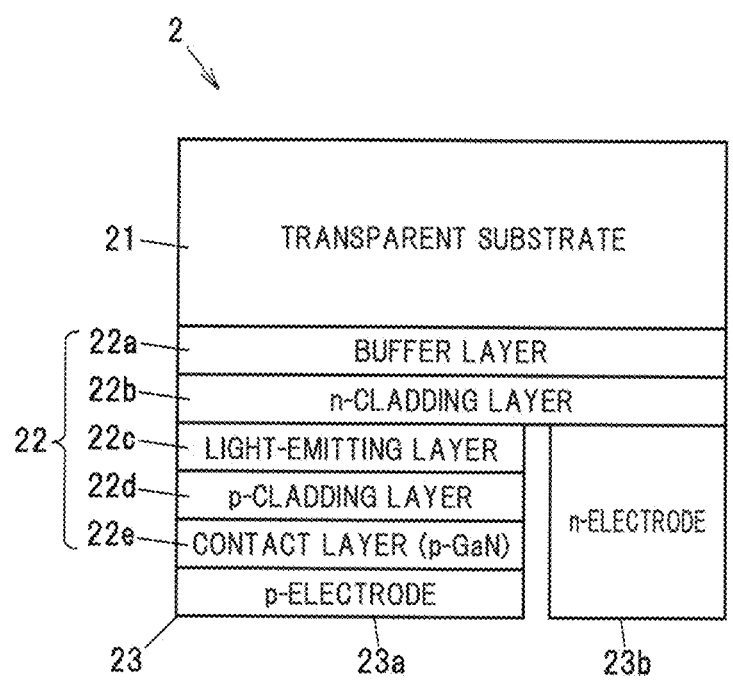
FIG. 2 is a schematic explanatory diagram illustrating an example of a stacked structure of a semiconductor light-emitting element.

FIG. 2 is a schematic explanatory diagram illustrating an example of a stacked structure of the semiconductor light-emitting element 2. As shown in FIG. 2, the semiconductor light-emitting element 2 in the present embodiment has a transparent substrate 21 made of sapphire, an AlGaN-based nitride semiconductor layer 22 provided on the transparent substrate 21, and an electrode 23.

In the present embodiment, the nitride semiconductor layer 22 is configured in such a manner that a buffer layer 22a including AlN, an n-cladding layer 22b including n-type AlGaN, a light-emitting layer 22c including AlGaN, a p-cladding layer 22d including p-type AlGaN and a contact layer 22e including p-type GaN are sequentially formed in this order from a transparent substrate 21-side. The electrode 23 has an anode-side electrode (p-electrode) 23a provided on the contact layer 22e and a cathode-side electrode (n-electrode) 23b provided on the n-cladding layer 22b.

(Protective Element 3)

The protective element 3 is e.g., a Zener diode which can maintain a constant voltage value regardless of a current value.

(Semiconductor Package 4)

The semiconductor package 4 includes a semiconductor package substrate 5 for housing the semiconductor light-emitting element 2 and the protective element 3, a lid member 6 mounted to cover the semiconductor light-emitting element 2 and the protective element 3, and a joining member 7 for joining between the semiconductor package substrate 5 and the lid member 6.

(Semiconductor Package Substrate 5)

Figure 3A:
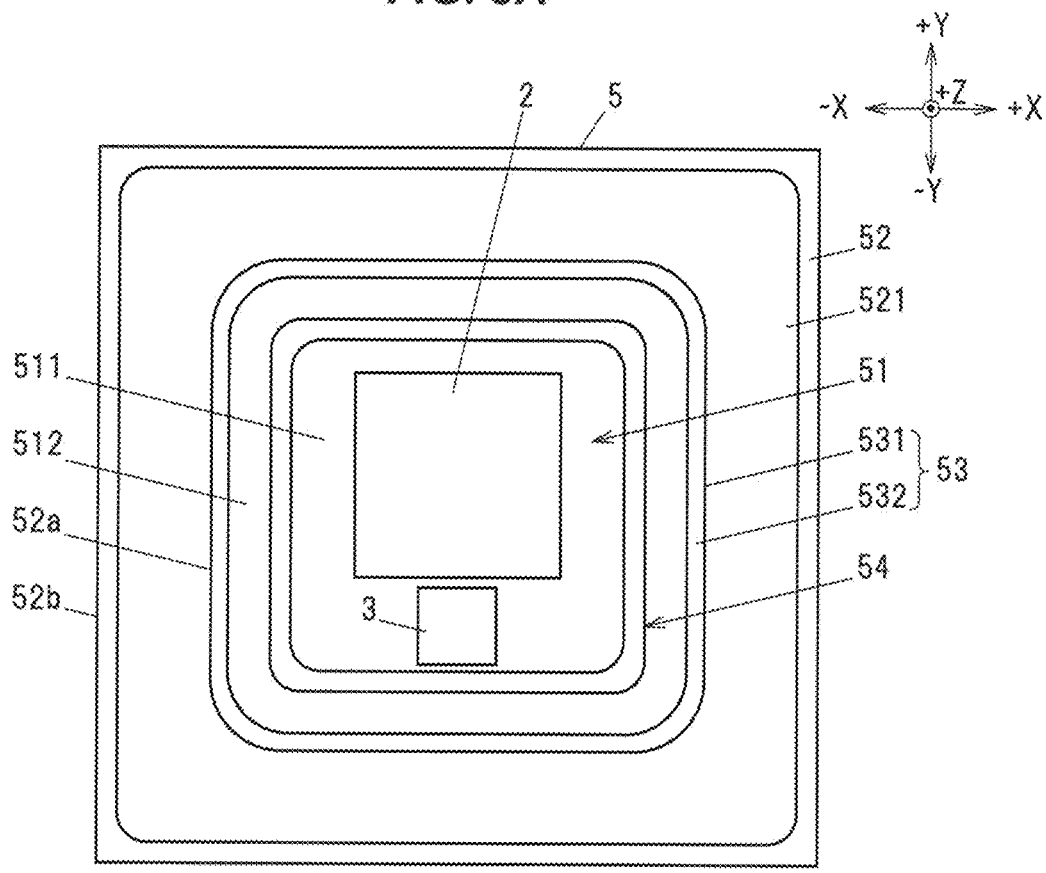
Figure 3B:
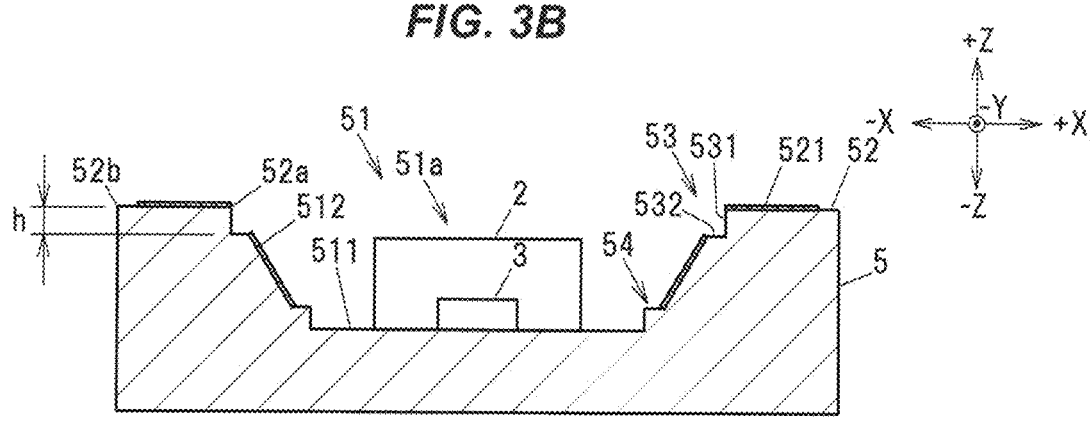

FIGS. 3A and 3B are diagrams illustrating an example configuration of the semiconductor package substrate 5, wherein FIG. 3A is a plan view and FIG. 3B is a cross sectional view taking along A-A in FIG. 1. The semiconductor package substrate 5 is an inorganic material substrate including ceramic. In particular, the semiconductor package substrate 5 is made of, e.g., a high temperature co-fired ceramic (HTCC) multi-layered substrate.

The semiconductor package substrate 5 is formed in a substantially rectangular parallelepiped shape and has a recessed cavity 51 for housing the semiconductor light-emitting element 2 and the protective element 3 on one surface (a surface in the +Z direction in the drawing, hereinafter, also referred to as the "upper surface"). The cavity 51 is an example of the semiconductor housing space.

The cavity 51 includes a mounting surface 511 provided on a bottom side (on the −Z direction-side in the drawing), and a reflective wall 512 provided around the mounting surface 511 for reflecting light (particularly, ultraviolet light including deep ultraviolet light in this example).

The mounting surface 511 is a bottom surface on which the semiconductor light-emitting element 2 and the protective element 3 are mounted, and an electrode for connecting the semiconductor light-emitting element 2 to the protective element 3 (hereinafter, also referred to as a "substrate-side electrode") is provided on the mounting surface 511 even though the illustration is omitted.

The reflective wall 512 is configured to reflect ultraviolet light emitted from the semiconductor light-emitting element 2 mounted on the mounting surface 511 and guide the ultraviolet light to an opening 51a of the cavity 51. Therefore, the reflective wall 512 preferably includes an inclined surface which is widened outward (in a direction of separating from the center of the cavity 51), from the mounting surface 511 toward the opening 51a of the cavity 51, as the distance from the mounting surface 511 increases. The angle formed between the mounting surface 511 and the reflective wall 512 is, e.g., 60±5°.

The reflective wall 512 is made of a metal film. To increase reflectivity to ultraviolet light and improve light extraction efficiency, the metal film may be, e.g., a deposited Al film made of Al.

In addition, a mounting region (see the dotted line and "R" in FIG. 5B) for mounting the lid member 6 is formed at a rim portion 52 of the semiconductor package substrate 5. The rim portion 52 here is a frame-shaped region on the upper surface of the semiconductor package substrate 5. The mounting region R is a region which is part of the rim portion 52 and is joined to the lid member 6 via the molten joining member 7.

The mounting region R is covered with an Au plating film 521. The Au plating film 521 forms a melting pattern on which the joining member 7 is melted.

The Au plating film 521 is coated in a rectangular frame shape along the rim portion 52 of the semiconductor package substrate 5. In addition, the Au plating film 521 is formed over a region spanning from an inner edge 52a (on the cavity 51-side) of the rim portion 52 to a position slightly inside with respect to an outer edge 52b (on the side away from the cavity 51) of the rim portion 52. Thus, the width of the Au plating film 521 is smaller than the width of the rim portion 52.

Although the thickness of the Au plating film 521 is illustrated to be thick in FIG. 3B for convenience of explanation, the actual thickness of the Au plating film 521 is much thinner than the illustrated thickness and is negligible relative to the semiconductor package substrate 5 and the lid member 6.

The semiconductor package substrate 5 also has a first flow-suppressing portion 53 formed between the rim portion 52 and the reflective wall 512. The first flow-suppressing portion 53 spatially divides the reflective wall 512 and the mounting region R (particularly, the Au plating film 521) in such a manner that the joining member 7 does not flow from the mounting region R into the cavity 51 by trickling down the reflective wall 512.

The first flow-suppressing portion 53 has a step shape. In particular, the first flow-suppressing portion 53 is a stepped portion including a step 531 (or a facet 531 on a terrace 532) and the terrace 532. The step 531 is a flat surface which is connected to the inner edge 52a of the rim portion 52 of the semiconductor package substrate 5 and extends in a direction toward a mounting surface 511 (in the −Z direction in the drawing). The terrace 532 is a flat surface which is connected to the step 531, extends toward the cavity 51 and is then connected to the reflective wall 512. The terrace 532 is an example of the separating surface. The step 531 and the terrace 532 are not necessarily flat surfaces and may be curved surfaces or surfaces with irregularity.

The step 531 is preferably connected perpendicularly to the rim portion 52 of the semiconductor package substrate 5. In addition, the terrace 532 is preferably connected perpendicularly to the step 531. In other words, the first flow-suppressing portion 53 is preferably a vertical step.

"Perpendicular/vertical" here includes not only the case where the formed angle is exactly 90° but also the case where there is a slight error (e.g., within 1°) which could occur during the course of manufacturing, etc. Hereinafter, the same kind of explanation will be omitted.

The first flow-suppressing portion 53 has a height h with which the joining member 7 overflowing from the mounting region R toward the cavity 51 (see "7A" in FIG. 8) does not reach the reflective wall 512 at the time of mounting the lid member 6 on the rim portion 52 of the semiconductor package substrate 5. The height h of the first flow-suppressing portion 53 here is a distance between the mounting region R and the reflective wall 512 in the thickness direction of the semiconductor package substrate 5 (the Z direction in the drawing) and refers to the height of the step 531 in the present embodiment.

The semiconductor package substrate 5 may further include a second flow-suppressing portion 54 which is formed between the mounting surface 511 and the reflective wall 512. The second flow-suppressing portion 54 has a function of suppressing the joining member 7 from trickling down the reflective wall 512 and flowing to the mounting surface 511. The second flow-suppressing portion 54 may be made of a vertical step, in the same manner as the first flow-suppressing portion 53.

The semiconductor light-emitting element 2 is housed in the cavity 51 and is mounted on the mounting surface 511. The semiconductor light-emitting element 2 is flip-chip mounted on the semiconductor package substrate 5, with the transparent substrate 21 facing upward (on the opening 51a-side of the cavity 51, on the +Z direction-side in the drawing) and the nitride semiconductor layer 22 facing downward (on the mounting surface 511-side, on the −Z direction-side in the drawing). The electrodes 23a, 23b are electrically connected, e.g., via gold bumps, to the substrate-side electrode provided on the semiconductor package substrate 5.

[Lid Member 6]

Figure 4:
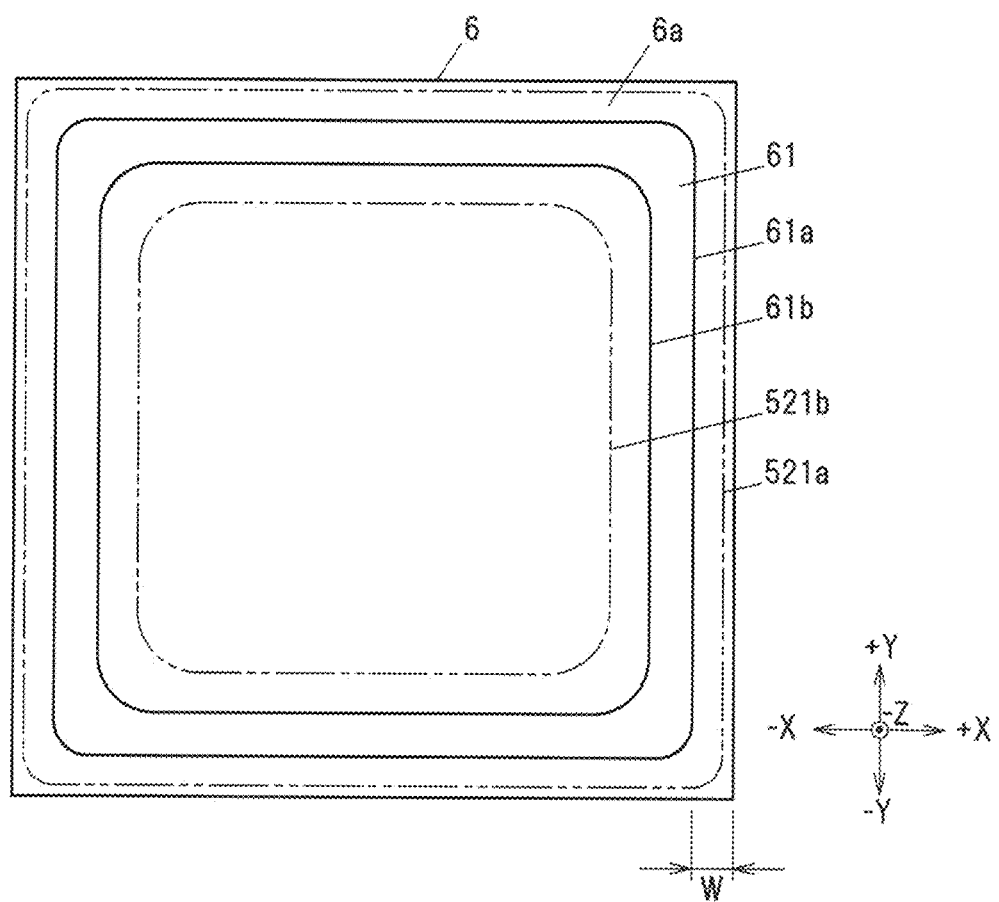
FIG. 4 is a bottom view showing an example configuration of a lid member.

FIG. 4 is a bottom view showing an example configuration of the lid member 6. The phantom lines are imaginary lines indicating the position of the Au plating film 521 when the lid member 6 is mounted on the semiconductor package substrate 5 (see FIG. 5). The lid member 6 is mounted in the mounting region R of the rim portion 52 of the semiconductor package substrate 5. The lid member 6 is, e.g., a glass lid including quarts glass. The lid member 6 only needs to be made of a material transparent to ultraviolet light and may be made of, e.g., crystallized quartz or sapphire.

As shown in FIG. 4, a metal film 61 having a rectangular frame shape is provided on a bottom surface 6a of the lid member 6. The metal film 61 is made of a metal having properties that the molten joining member 7 is adhered thereto. In addition, the metal film 61 is a stacked-structure film for temporary attachment of a preform of the joining member 7. The "preform" here means the joining member 7 before being melted. The thickness of the preform of the joining member 7 is, e.g., 20±2 μm.

In the state that the lid member 6 is mounted on the semiconductor package substrate 5, an outer rim 61a of the metal film 61 is located on the inner side of the lid member 6 relative to an outer rim 521a of the Au plating film 521 by a predetermined distance W. Then, an inner rim 61b of the metal film 61 is located on the outer side of the lid member 6 relative to an inner rim 521b of the Au plating film 521. This makes the lid member 6 less likely to come off from the semiconductor package substrate 5 after joining the lid member 6 to the semiconductor package substrate 5.

[Joining Member 7]

Figure 5A:
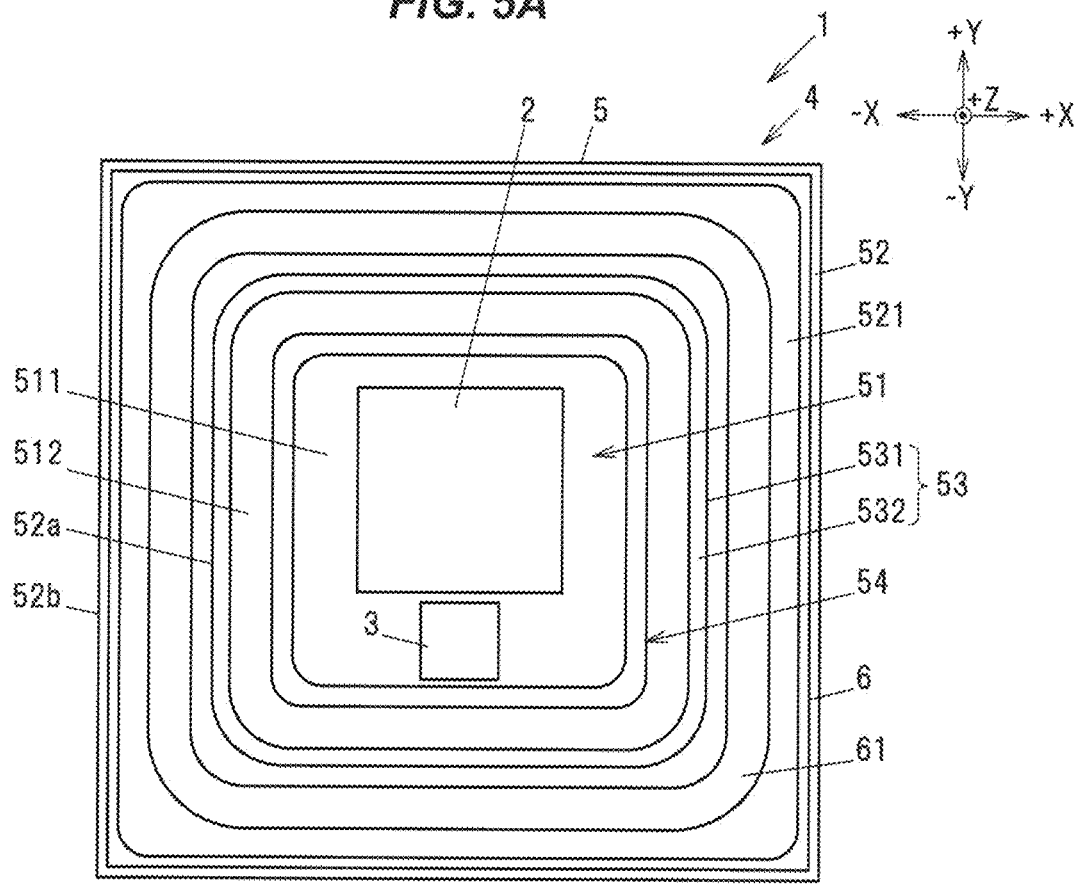
Figure 5B:
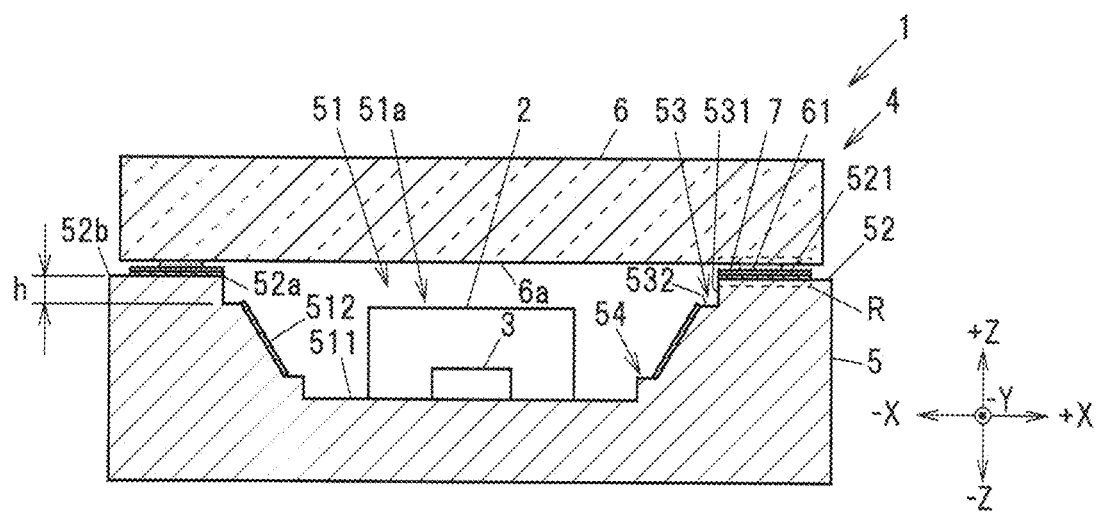

FIGS. 5A and 5B are diagrams illustrating an example configuration of the semiconductor light-emitting device 1, wherein FIG. 5A is a plan view and FIG. 5B is a vertical cross-sectional view. As shown in FIG. 5B, the joining member 7 is provided between the Au plating film 521 of the semiconductor package substrate 5 and the metal film 61 of the lid member 6 in the state that the lid member 6 is mounted, and the joining member 7 joins and seals between the semiconductor package substrate 5 and the lid member 6.

In particular, the joining member 7 joins the semiconductor package substrate 5 to the lid member 6 by soldering. The joining member 7 is, e.g., AuSn eutectic solder made of an alloy consisting mainly of gold (Au) and tin (Sn). This AuSn eutectic solder contains, e.g., 20 wt % of Sn.

The joining member 7 is melted by soldering and joins and integrates the lid member 6 and the semiconductor package substrate 5 in such a manner that an inner space including the lid member 6 and the semiconductor package substrate 5 is sealed from the outside.

Although the thickness of the Au plating film 521, the thickness of the metal film 61 and the thickness of the joining member 7 are illustrated to be thick in FIG. 5B for convenience of explanation, the actual thickness of the Au plating film 521, the actual thickness of the metal film 61 and the actual thickness of the joining member 7 are much thinner than the illustrated thicknesses and are negligible relative to the semiconductor package substrate 5 and the lid member 6.

Example

Figure 6A:
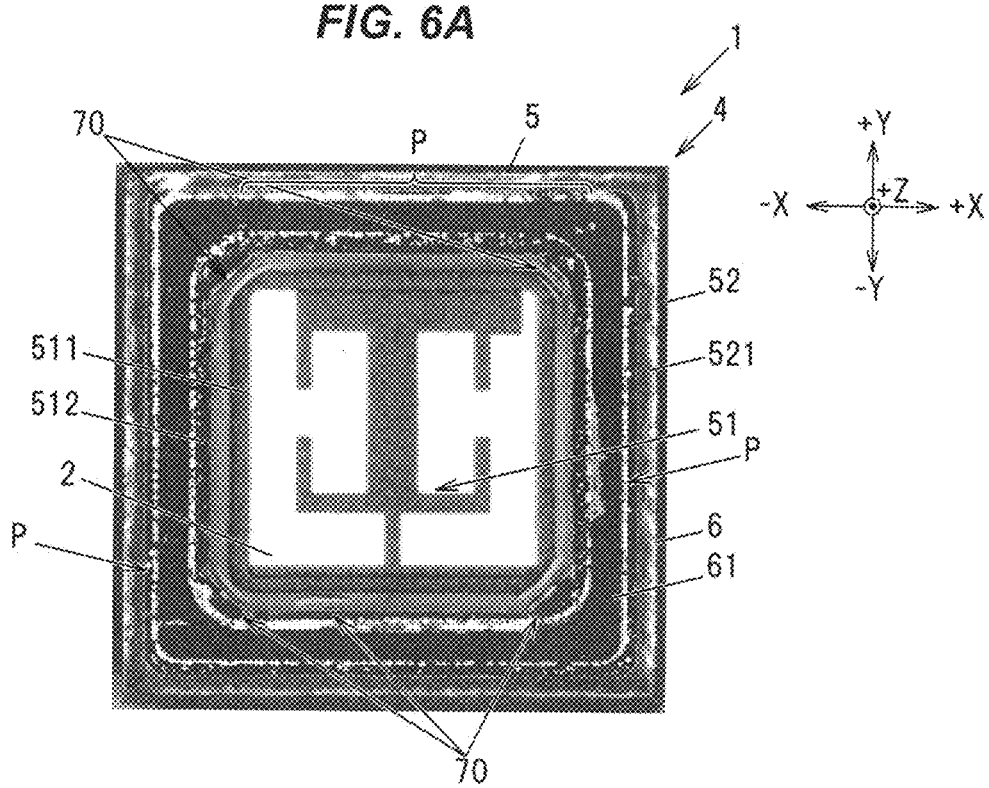
Figure 6B:
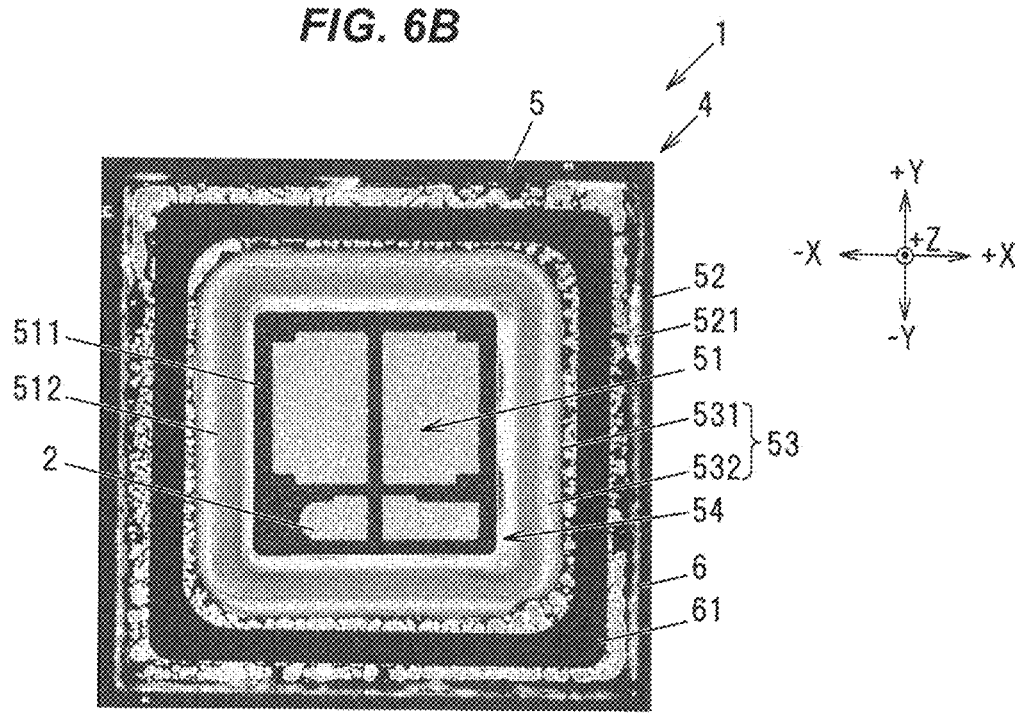

FIGS. 6A and 6B are photographic images showing an example result of adhesion between the semiconductor package substrate 5 and the lid member 6, wherein FIG. 6A shows the semiconductor light-emitting device 1 in Comparative Example and FIG. 6B shows the semiconductor light-emitting device 1 in Example of the invention. These photographic images were obtained by taking pictures of the semiconductor light-emitting devices 1 from above (on the +Z direction-side in the drawing). In Comparative Example, the semiconductor light-emitting device 1 is not provided with the first flow-suppressing portion 53.

In the semiconductor light-emitting device 1 of Comparative Example, a solder flow 70 which is the AuSn eutectic solder flowing into the cavity 51 occurred, as shown in FIG. 6A. In addition, some cracks of quartz glass (see "P"), which are considered to be caused by the solder flow 70, were generated on the lid member 6.

Meanwhile, in the semiconductor light-emitting device 1 of Example of the invention, i.e., in the semiconductor light-emitting device 1 provided with the first flow-suppressing portion 53, the solder flow 70 did not occur, as shown in FIG. 6B. In addition, cracks P of quartz glass were not generated on the lid member 6. The above comparison shows that, by providing the first flow-suppressing portion 53, it is possible to suppress the AuSn eutectic solder from flowing into the cavity 51 and thereby suppresses cracks on the lid member 6.

FIG. 7 is a diagram in which the results of examining whether or not the lid member 6 was successfully joined in some experimentally-manufactured semiconductor light-emitting devices 1 are shown in a table. The inventors experimentally made eight semiconductor light-emitting devices 1 with different conditions and examined how the surface area of the mounting region R and the volume of AuSn eutectic solder preform affect sealing properties of the lid member 6.

Here, "Area (mm$^2$)" indicates the surface area of the mounting region R, i.e., the surface area of the Au plating film 521. "Thickness (mm)" indicates the thickness on the assumption that the AuSn eutectic solder preform is melted and spread in the surface area shown in the column "Area (mm$^2$)". That is, the values obtained by dividing the values shown in "AuSn eutectic solder, Preform volume (mm$^3$)" by the values shown in "Area (mm$^2$)" are shown in the column "Thickness (mm)". The column "Quartz glass joining" is regarding the adhering properties of the lid member 6 and shows the results of examining whether or not the lid member 6 was successfully joined.

In addition, in the column "Reflective wall", "Vertical surface" indicates that the reflective wall 512 of the semiconductor package substrate 5 has a vertical structure, and "Inclined surface" indicates that the reflective wall 512 of the semiconductor package substrate 5 has an inclined structure.

As shown in FIG. 7, the lid member 6 was successfully joined in each case when the surface area of the Au plating film 521 was not less than 4.965 mm$^2$ (see No. 2, No. 3 and No. 8). This result shows that it is possible to improve the adhering properties of the lid member 6 by adjusting the surface area of the Au plating film 521 to not less than 4.965 mm$^2$.

When the surface area of the Au plating film 521 is 4.965 mm$^2$, the volume of the AuSn eutectic solder preform provided on the metal film 61 of the lid member 6 is 0.0466 mm$^3$. Therefore, the volume of the AuSn eutectic solder preform is preferably not less than 0.0466 mm$^3$.

Figure 8:
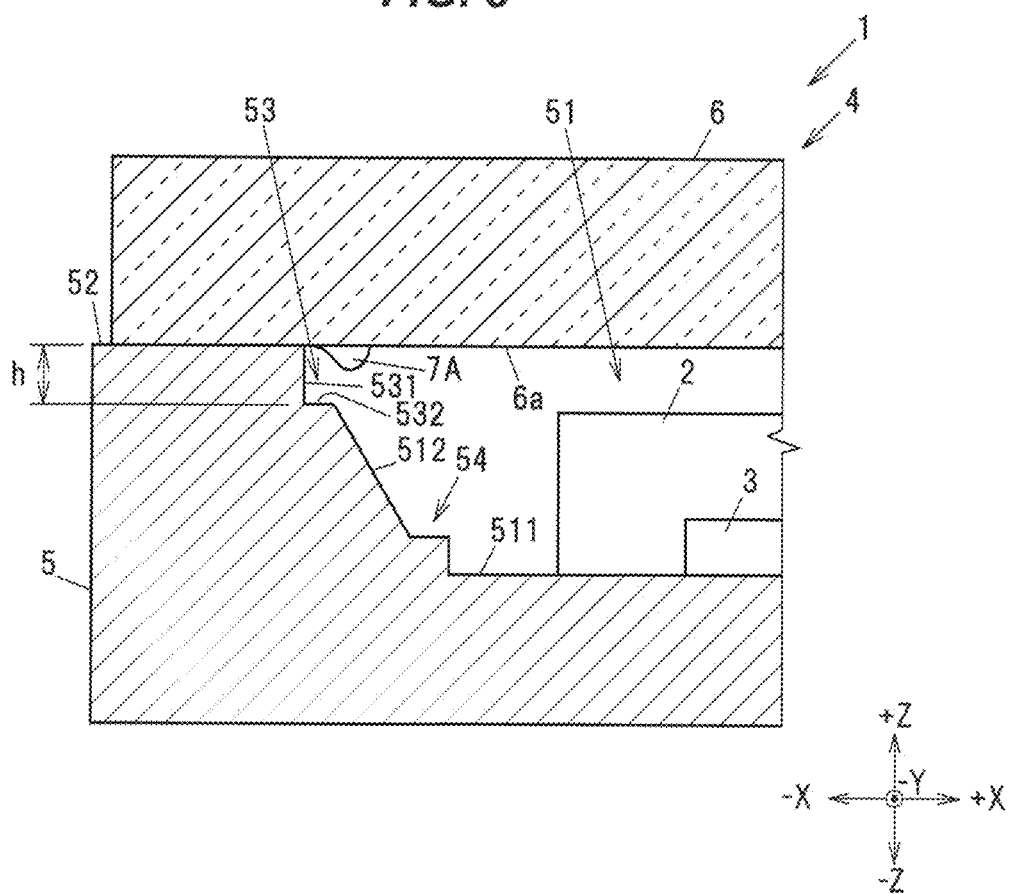
FIG. 8 is a schematic cross-sectional view showing the semiconductor light-emitting device in the state that AuSn eutectic solder protrudes toward a cavity.

FIG. 8 is a schematic cross-sectional view showing the semiconductor light-emitting device 1 in the state that AuSn eutectic solder protrudes toward the cavity 51 when joining the lid member 6 to the semiconductor package substrate 5. In FIG. 8, the Au plating film 521 and the metal film 61 are omitted for convenience of explanation.

As shown in FIG. 8, since the first flow-suppressing portion 53 is provided, an overrunning AuSn eutectic solder (the solder flow) 70 protruding from the mounting region R firstly moves along the bottom surface 6a of the lid member 6 and does not flow down toward the mounting surface 511. In addition, the overrunning AuSn eutectic solder (the solder flow) 70 protruding from the mounting region R forms a hemispherical shape due to surface tension and thus can stay on the bottom surface 6a of the lid member 6 without falling.

In this case, when the height h of the first flow-suppressing portion 53 is adjusted to not less than a predetermined height, it is possible to suppress the overflown AuSn eutectic solder (the solder flow) 70 from reaching the reflective wall 512. In other words, it is possible to suppress the overflown AuSn eutectic solder (the solder flow) 70 from trickling down the reflective wall 512 and flowing into the cavity 51. As described above, by providing the first flow-suppressing portion 53, it is possible to suppress the AuSn eutectic solder from flowing into the cavity 51.

As an example, when the surface area of the Au plating film 521 is 4.965 mm$^2$, the height h of the first flow-suppressing portion 53 is preferably not less than 0.15 mm. This can improve the adhering properties of the lid member 6 and also can suppress the AuSn eutectic solder from flowing into the cavity 51 and thereby suppress the adhered lid member 6 from cracking or coming off.

Modification

Figure 9:
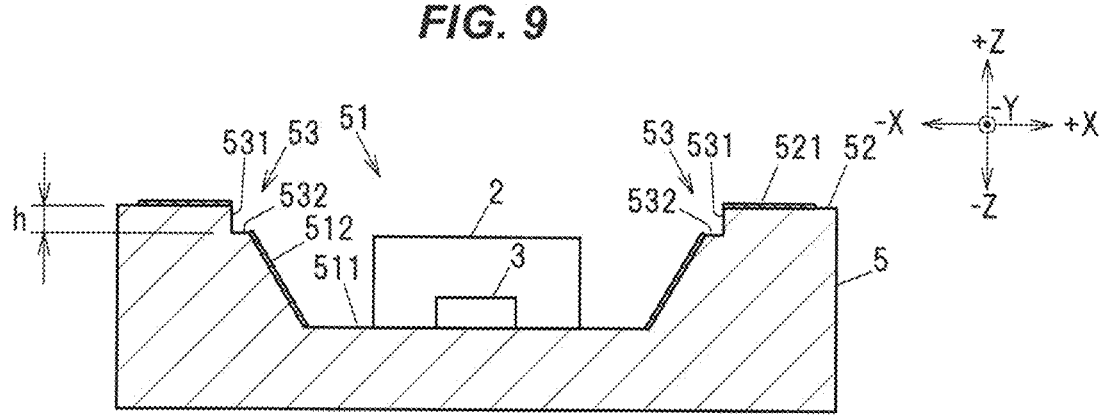
FIG. 9 is a vertical cross-sectional view showing a configuration of the semiconductor package substrate in a modification of the invention.

FIG. 9 is a vertical cross-sectional view showing a configuration of the semiconductor package substrate 5 in a modification of the invention. As shown in FIG. 9, the semiconductor package substrate 5 does not necessarily need to have the second flow-suppressing portion 54 and may be configured that the reflective wall 512 is directly connected to the mounting surface 511.

SUMMARY OF THE EMBODIMENT

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A semiconductor package substrate (5) including: a semiconductor housing space (51) including a mounting surface (511) being provided on a bottom side and configured to mount a semiconductor light-emitting element (2), and a reflective wall (512) being provided around the mounting surface (511) and configured to reflect light emitted from the semiconductor light-emitting element (2) to be mounted on the mounting surface (511); a mounting region (R) being provided at a rim portion (52) and configured to mount a lid member (6) for covering the semiconductor light-emitting element (2); and a flow-suppressing portion (53) separating the mounting region (R) and the reflective wall (512) spatially in such a manner that a joining member (7) for joining the lid member (6) to the rim portion (52) is suppressed from flowing from the mounting region (R) into the semiconductor housing space.

[2] The semiconductor package substrate (5) described in [1], wherein the flow-suppressing portion (53) has a step shape and includes a facet (531) being connected to the rim portion (52) and extending in a direction toward the mounting surface (511), and a separating surface (532) being connected to the facet (531) and extending toward the semiconductor housing space (51).

[3] The semiconductor package substrate (5) described in [2], wherein the facet (531) is connected perpendicularly to the rim portion (52), and the separating surface (532) is connected perpendicularly to the facet (531).

[4] The semiconductor package substrate (5) described in any one of [1] to [3], wherein the mounting region (R) is covered with an Au plating film (521).

[5] The semiconductor package substrate (5) described in [4], wherein the Au plating film (521) has a surface area of not less than 4.965 mm².

[6] The semiconductor package substrate (5) described in any one of [1] to [5], wherein a volume of a preform of the joining member (7) is not less than 0.0466 mm³.

[7] The semiconductor package substrate (5) described in [5] or [6], wherein a height of the flow-suppressing portion (53) is not less than 0.15 mm.

[8] The semiconductor package substrate (5) described in any one of [1] to [7], wherein the flow-suppressing portion (53) is provided as a first flow-suppressing portion (53), and a second flow-suppressing portion (54) is provided between the mounting surface (511) and the reflective wall (512).

[9] The semiconductor package substrate (5) described in any one of [1] to [8], wherein the reflective wall (512) includes an inclined surface being widened outward as a distance from the mounting surface (511) increases.

[10] The semiconductor package substrate (5) described in any one of [1] to [9], wherein the reflective wall (512) is covered with a deposited Al film including Al.

[11] A semiconductor package (4), including: the semiconductor package substrate (5) described in any one of [1] to [10]; and the lid member (6) being mounted on the mounting region (R).

[12] The semiconductor package (4) described in [11], wherein the lid member (6) includes quartz glass.

[13] A semiconductor light-emitting device (1), including: the semiconductor package (4) described in [11] or [12]; and the semiconductor light-emitting element (2) mounted on the semiconductor package substrate (5).

What is claimed is:

1. A semiconductor package substrate, comprising:
a semiconductor housing space including a mounting surface being provided on a bottom side and configured to mount a semiconductor light-emitting element, and a reflective wall being provided around the mounting surface and configured to reflect light emitted from the semiconductor light-emitting element to be mounted on the mounting surface;
a mounting region being provided at a rim portion and configured to mount a lid member for covering the semiconductor light-emitting element; and
a flow-suppressing portion separating the mounting region and the reflective wall spatially in such a manner that a joining member joining the lid member to the rim portion is suppressed from flowing from the mounting region into the semiconductor housing space;
wherein the flow-suppressing portion comprises a step shape and includes a facet being connected to the rim portion and extending in a direction toward the mounting surface, and a separating surface being connected to the facet and extending toward the semiconductor housing space; and
wherein the facet is connected perpendicularly to the rim portion, and the separating surface is connected perpendicularly to the facet.

2. The semiconductor package substrate according to claim 1, wherein a volume of a preform of the joining member is not less than 0.0466 mm³.

3. The semiconductor package substrate according to claim 1, wherein the reflective wall comprises an inclined surface being widened outward as a distance from the mounting surface increases.

4. The semiconductor package substrate according to claim 1, wherein the reflective wall is covered with a deposited Al film comprising Al.

5. A semiconductor package, comprising:
the semiconductor package substrate according to claim 1; and
the lid member being mounted on the mounting region.

6. The semiconductor package according to claim 5, wherein the lid member comprises quartz glass.

7. A semiconductor light-emitting device, comprising:
the semiconductor package according to claim 5; and
the semiconductor light-emitting element being mounted on the semiconductor package substrate.

8. The semiconductor package substrate according to claim 1, wherein the mounting region is covered with an Au plating film.

9. The semiconductor package substrate according to claim 8, wherein the Au plating film comprises a surface area of not less than 4.965 mm².

10. The semiconductor package substrate according to claim 9, wherein a height of the flow-suppressing portion is not less than 0.15 mm.

11. A semiconductor package substrate, comprising:
a semiconductor housing space including a mounting surface being provided on a bottom side and configured to mount a semiconductor light-emitting element, and a reflective wall being provided around the mounting surface and configured to reflect light emitted from the semiconductor light-emitting element to be mounted on the mounting surface;
a mounting region being provided at a rim portion and configured to mount a lid member for covering the semiconductor light-emitting element; and
a flow-suppressing portion separating the mounting region and the reflective wall spatially in such a manner that a joining member joining the lid member to the rim portion is suppressed from flowing from the mounting region into the semiconductor housing space;
wherein the flow-suppressing portion is provided as a first flow-suppressing portion, and a second flow-suppressing portion is provided between the mounting surface and the reflective wall.

\* \* \* \* \*